United States Patent
Dix et al.

(10) Patent No.: US 9,812,380 B2
(45) Date of Patent: Nov. 7, 2017

(54) BUMPS BONDS FORMED AS METAL LINE INTERCONNECTS IN A SEMICONDUCTOR DEVICE

(71) Applicant: Microchip Technology Incorporated, Chandler, AZ (US)

(72) Inventors: Greg Dix, Tempe, AZ (US); Roger Melcher, Gilbert, AZ (US); Harold Kline, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/673,347

(22) Filed: Mar. 30, 2015

(65) Prior Publication Data

US 2016/0013121 A1    Jan. 14, 2016

Related U.S. Application Data

(60) Provisional application No. 62/002,164, filed on May 22, 2014.

(51) Int. Cl.
*H01L 23/495* (2006.01)
*H01L 23/31* (2006.01)
(Continued)

(52) U.S. Cl.
CPC .... *H01L 23/49513* (2013.01); *H01L 23/3114* (2013.01); *H01L 23/3171* (2013.01);
(Continued)

(58) Field of Classification Search
CPC ......... H01L 23/49513; H01L 23/49562; H01L 23/3171; H01L 23/4951; H01L 23/3114
See application file for complete search history.

(56) References Cited

U.S. PATENT DOCUMENTS 6,066,877 A * 5/2000 Williams ............ H01L 23/4824
257/337
6,645,791 B2 * 11/2003 Noquil ................ H01L 21/4853
257/E23.004
(Continued)

FOREIGN PATENT DOCUMENTS

| EP | 0714128 A2 | 5/1996 | ............. H01L 21/28 |
| EP | 1432030 A2 | 6/2004 | ......... H01L 21/3205 |
| GB | 2344463 A | 6/2000 | ............. H01L 21/60 |

OTHER PUBLICATIONS

International Search Report and Written Opinion, Application No. PCT/US2015/031377, 22 pages, dated Nov. 24, 2015.

*Primary Examiner* — Peniel M Gumedzoe
(74) *Attorney, Agent, or Firm* — Slayden Grubert Beard PLLC

(57) ABSTRACT

A semiconductor power chip has a semiconductor power device formed on a semiconductor die; wherein the semiconductor power device comprises an array of conductive contact elements; a passivation layer formed over the plurality of conductive contact elements, the passivation layer comprising passivation openings over a plurality of the conductive contact elements; and an array of conductive bumps including one or more interconnection bumps, wherein each interconnection bump is formed over the passivation layer and extends into at least two of the passivation openings and into contact with at least two underlying conductive contact elements to thereby provide a conductive coupling between the at least two underlying conductive contact elements.

26 Claims, 16 Drawing Sheets

(51) Int. Cl.
*H01L 23/482* (2006.01)
*H01L 23/00* (2006.01)
*H01L 23/528* (2006.01)

(52) U.S. Cl.
CPC ...... *H01L 23/4824* (2013.01); *H01L 23/4951* (2013.01); *H01L 23/49541* (2013.01); *H01L 23/49562* (2013.01); *H01L 23/49575* (2013.01); *H01L 24/05* (2013.01); *H01L 24/13* (2013.01); *H01L 24/14* (2013.01); *H01L 23/528* (2013.01); *H01L 24/16* (2013.01); *H01L 24/48* (2013.01); *H01L 2224/05553* (2013.01); *H01L 2224/05554* (2013.01); *H01L 2224/131* (2013.01); *H01L 2224/13014* (2013.01); *H01L 2224/1319* (2013.01); *H01L 2224/13022* (2013.01); *H01L 2224/13028* (2013.01); *H01L 2224/14133* (2013.01); *H01L 2224/1613* (2013.01); *H01L 2224/16245* (2013.01); *H01L 2224/48245* (2013.01); *H01L 2924/00014* (2013.01); *H01L 2924/1305* (2013.01); *H01L 2924/19107* (2013.01)

(56) References Cited

U.S. PATENT DOCUMENTS

| | | | |
|---|---|---|---|
| 7,560,808 B2 | 7/2009 | Korec et al. | 257/691 |
| 2005/0023670 A1* | 2/2005 | Hata | H01L 23/49562 257/690 |
| 2006/0030071 A1 | 2/2006 | Mizukoshi et al. | 438/106 |
| 2006/0094234 A1* | 5/2006 | Soda | H01L 21/76808 438/638 |
| 2006/0199373 A1* | 9/2006 | Miyajima | H01L 21/02126 438/629 |
| 2008/0035959 A1* | 2/2008 | Jiang | H01L 23/3107 257/204 |
| 2009/0184352 A1* | 7/2009 | Yamaguchi | H01L 21/823487 257/296 |
| 2011/0109287 A1* | 5/2011 | Nakamura | H01L 23/3107 323/282 |
| 2012/0126406 A1 | 5/2012 | Dix | 257/738 |

* cited by examiner

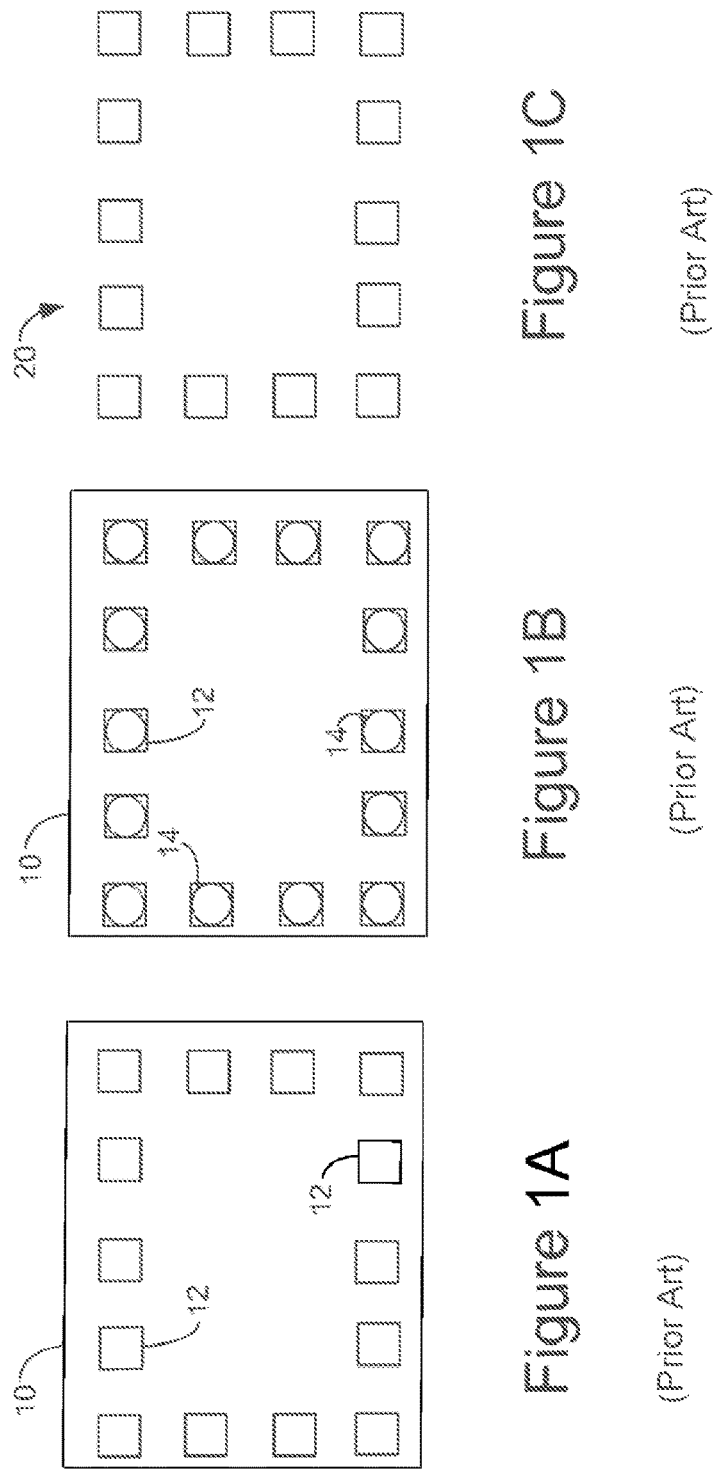

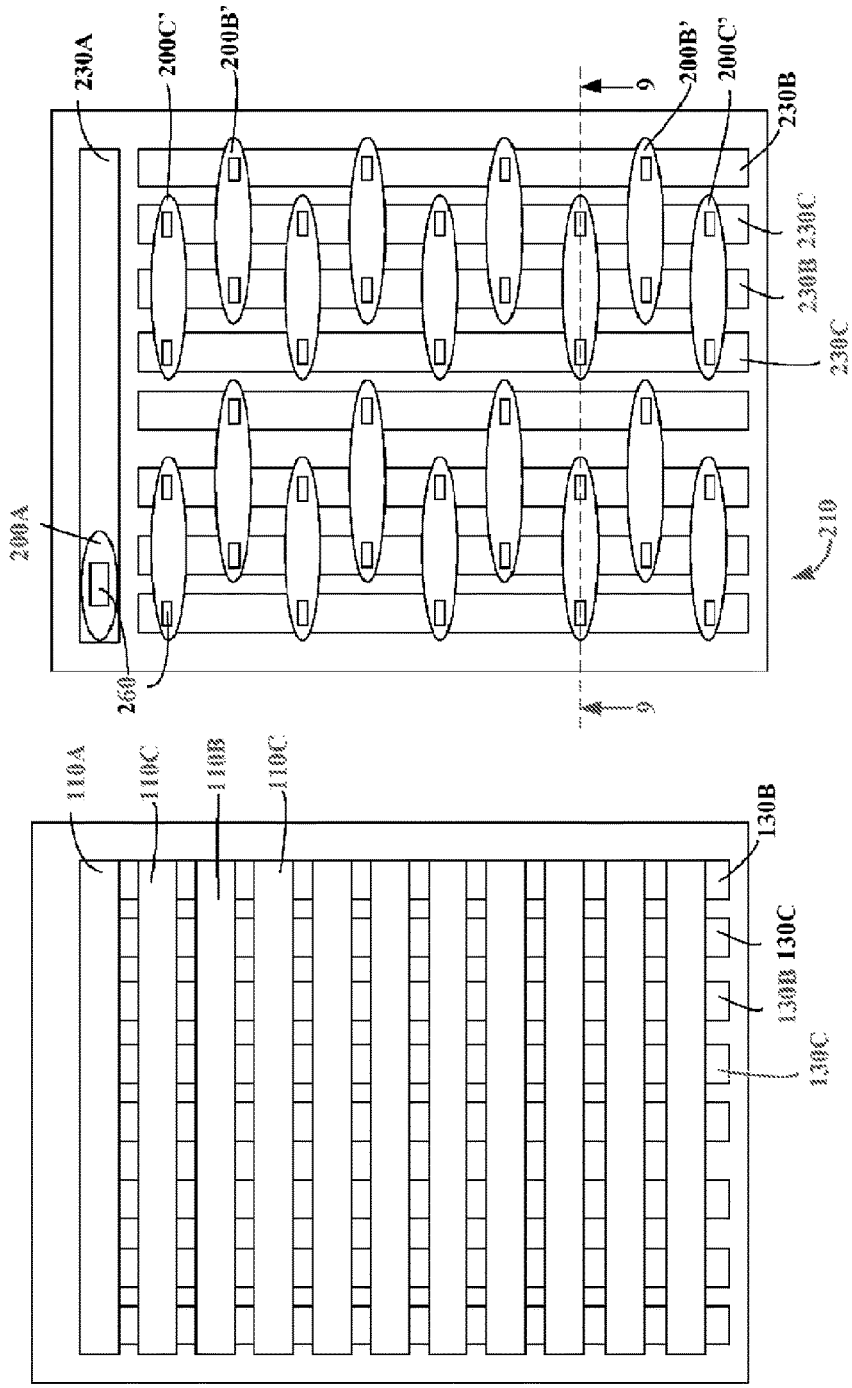

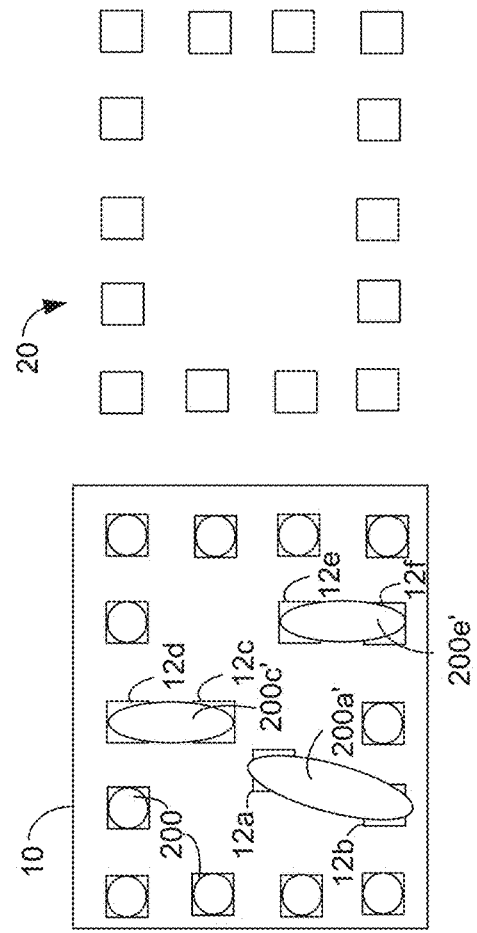
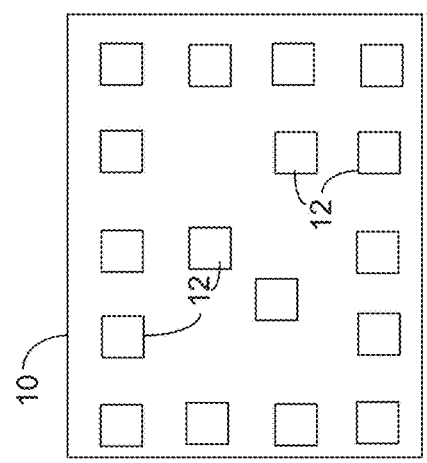
Figure 7C
Figure 7B
Figure 7A

BUMPS BONDS FORMED AS METAL LINE INTERCONNECTS IN A SEMICONDUCTOR DEVICE

CROSS-REFERENCE TO RELATED APPLICATIONS

This application claims the benefit of U.S. Provisional Application No. 62/002,164 filed on May 22, 2014, which is incorporated herein in its entirety.

TECHNICAL FIELD

The present disclosure relates to semiconductor devices, e.g., power-FETs or other semiconductor power devices, and more particularly to fabrication of a semiconductor power device to a lead-frame using bump bonds that act as interconnects between separate metal lines.

Semiconductor power devices typically operate at high current densities, and as such, require current carrying conductors having low enough contact resistances to adequately handle the current to and from the device. There are limitations, however, for metal deposition thickness during fabrication of the semiconductor power device. This metal deposition thickness limitation necessitates having to deposit metal conductors on both the front and back sides of the semiconductor power device, e.g., power field effect transistor (power-FET). But having to use back side contact of the power element(s) of the device, e.g., drain requires extensive processing to eliminate the series resistance of the semiconductor substrate, thereby adding significant cost to the final semiconductor power product.

SUMMARY

Therefore, it is desired to reduce processing steps in manufacturing a semiconductor power device, and thereby reduce manufacturing costs thereof.

According to an embodiment, a semiconductor power chip may comprise a semiconductor power device formed on a semiconductor die; wherein the semiconductor power device comprises: an array of conductive contact elements; a passivation layer formed over the plurality of conductive contact elements, the passivation layer comprising passivation openings over a plurality of the conductive contact elements; and an array of conductive bumps including one or more interconnection bumps, wherein each interconnection bump is formed over the passivation layer and extends into at least two of the passivation openings and into contact with at least two underlying conductive contact elements to thereby provide a conductive coupling between the at least two underlying conductive contact elements.

According to a further embodiment, the array of conductive contact elements may comprise at least one gate contact element, at least one source contact element, and at least one drain contact element. According to a further embodiment, the array of conductive contact elements may comprise a plurality of elongated contact strips arranged in parallel. According to a further embodiment, a plurality of passivation openings can be arranged over each source and drain contact elements. According to a further embodiment, the one or more interconnection bumps may comprise at least one source interconnection bump that provides a conductive coupling between at least two electrically isolated source regions. According to a further embodiment, the one or more interconnection bumps may comprise at least one drain interconnection bump that provides a conductive coupling between at least two electrically isolated drain regions. According to a further embodiment, the semiconductor power chip may further comprise a lead frame coupled to the array of conductive bumps, such that the one or more interconnection bumps provide a conductive coupling between at least a portion of the array of conductive contact elements and the lead frame. According to a further embodiment, the semiconductor power device may comprise only a single metal interconnect layer, which includes the array of conductive contact elements. According to a further embodiment, the array of conductive bumps may include one or more non-interconnection bumps, each extending into contact with only a single underlying conductive contact. According to a further embodiment, the array of conductive bumps may include only interconnection bumps.

According to another embodiment, a semiconductor power device may comprise a semiconductor power chip as described above and may further comprise: a lead-frame having an area comprising gate, source and drain lead-fingers adapted to match up with the array of conductive bumps for connecting to each of the at least one gate contact element, the plurality of source contact elements and the plurality of drain contact elements, and a housing surrounding said semiconductor power chip and said lead-frame.

According to yet another embodiment, a semiconductor power device may comprise at least a first and second semiconductor power chip, each semiconductor power chip being formed as described above and may further comprise: a lead-frame having an first and second area each first and second area comprising gate, source and drain lead-fingers adapted to match up with the array of conductive bumps for connecting to each of the at least one gate contact element, the plurality of source contact elements and the plurality of drain contact elements of said first and second semiconductor chips, respectively, and a housing surrounding said first and second semiconductor power chip and said lead-frame.

According to yet another embodiment, a semiconductor device may comprise a semiconductor power chip as described above and further comprise another chip; a lead-frame having a first area comprising gate, source and drain lead-fingers adapted to match up with the array of conductive bumps for connecting to each of the at least one gate contact element, the plurality of source contact elements and the plurality of drain contact elements of the semiconductor power chip and a second area configured for wire bonding said another chip, and a housing surrounding said semiconductor power chip, said another chip, and said lead-frame.

According to a further embodiment, the another chip can be a microcontroller chip operable to control said semiconductor power chip. According to a further embodiment, the another chip can be a pulse width modulation chip operable to control said semiconductor power chip. According to a further embodiment, the another chip can be mounted in flip-chip fashion. According to a further embodiment, the lead frame can be designed to provide connection between the another chip and the semiconductor power chip.

According to yet another embodiment, a semiconductor device may comprise at least a first and second semiconductor power chip, each semiconductor power chip being formed as described above and further comprise: a third chip; a lead-frame having an first and second area each first and second area comprising gate, source and drain lead-fingers adapted to match up with the array of conductive bumps for connecting to each of the at least one gate contact element, the plurality of source contact elements and the plurality of drain contact elements of said first and second semiconductor chips, respectively and a third area configured for wire bonding said another chip, and a housing surrounding said first and second semiconductor power chip, said third chip and said lead-frame.

According to a further embodiment, the third chip can be a microcontroller chip operable to control said semiconductor power chip. According to a further embodiment, the third chip can be a pulse width modulation chip operable to control said semiconductor power chip. According to a further embodiment, the third chip can be mounted in flip-chip fashion.

According to a further embodiment, the lead frame can be designed to provide connection between the third chip and the first and second semiconductor power chip.

According to yet another embodiment, a semiconductor power device may comprise a housing, a semiconductor power device comprising a semiconductor die and a lead-frame arranged in flip-chip configuration within said housing, wherein the semiconductor die comprises an array of conductive contact elements comprising at least one gate contact element, at least one source contact element, and at least one drain contact element, and a passivation layer formed over the plurality of conductive contact elements, the passivation layer comprising passivation openings over a plurality of the conductive contact elements, an array of conductive bumps including one or more interconnection bumps, wherein each interconnection bump is formed over the passivation layer and extends into at least two of the passivation openings and into contact with at least two underlying conductive contact elements to thereby provide a conductive coupling between the at least two underlying conductive contact elements, and wherein the lead-frame has an area comprising gate, source and drain lead-fingers adapted to match up with the array of conductive bumps for connecting to each of the at least one gate contact element, the plurality of source contact elements and the plurality of drain contact elements.

According to a further embodiment, the array of conductive contact elements may comprise a plurality of elongated contact strips arranged in parallel. According to a further embodiment, a plurality of passivation openings can be arranged over each source and drain contact elements. According to a further embodiment, the one or more interconnection bumps may comprise at least one source interconnection bump that provides a conductive coupling between at least two electrically isolated source regions. According to a further embodiment, the one or more interconnection bumps may comprise at least one drain interconnection bump that provides a conductive coupling between at least two electrically isolated drain regions.

BRIEF DESCRIPTION OF THE DRAWINGS

FIGS. 1A, 1B, and 1C show a conventional semiconductor die having an array of passivation openings, solder bumps and lead frame;

FIG. 6 shows a top view of metal layers of a conventional power transistor die;

FIGS. 7A, 7B, and 7C show a semiconductor die according to various embodiments having an array of passivation openings, associated solder bumps, and lead frame;

FIG. 8 shows a top view of a power transistor chip according to various embodiments;

DESCRIPTION

Figures 2A, 2B:
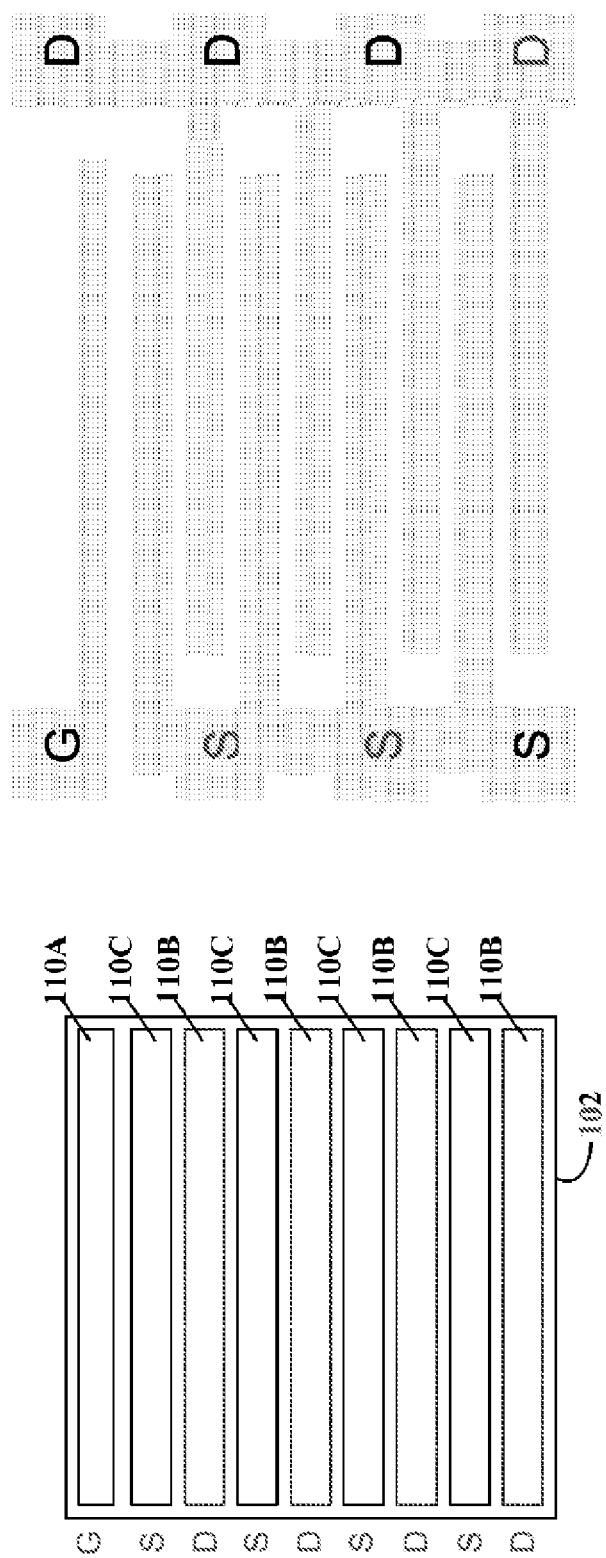
FIGS. 2A and 2B show a conventional power transistor die and associated lead frame.

As disclosed in co-pending application Ser. No. 13/288,108 filed on Nov. 3, 2011 and published as US 2012/0126406 (hereinafter "the '108 Application"), the entire contents of which application are herein incorporated by reference, a semiconductor power chip may have a semiconductor die having a power device fabricated on a substrate thereof, which power device is conductively connected to a corresponding lead-frame by an array of bump bonds, e.g., ball bumps or loaf bumps. For example, a semiconductor power chip may have a semiconductor die having a power device fabricated on a substrate thereof, wherein the power device has a plurality of gate metal contact regions, source metal contact regions, and drain metal contact regions arranged on top of the semiconductor die. A plurality of ball bumps or a loaf bump may be disposed on each metal contact region, and a lead-frame having an area comprising gate, source, and drain lead-fingers that match up with the plurality of ball bumps or the loaf bump for connecting to each of the metal contact regions.

As discussed in the '108 Application, using a bump or loaf array to distribute the current between elements of the semiconductor power device and a much thicker lead-frame eliminates the need for a separate backside contact and subsequent processing step(s). The bump or loaf array may comprise a single loaf bump or a plurality of ball bumps arranged in a "bump loaf" configuration on each of the semiconductor elements. The semiconductor power device may then be attached to a lead-frame using flip-chip ball bond techniques. This results in lower processing and manufacturing costs, and a smaller form-factor for the semiconductor power device. Low resistance substrates are not needed and an epitaxial silicon growth step is eliminated. Such a mounted power device can be combined and connected to a second chip within a housing, wherein the second chip may comprise a microcontroller or pulse width modulation controller.

The present disclosure provides further inventive improvements to the concepts disclosed in the '108 Application. For example, the present disclosure provides a method for forming bump bonds ("bumps") that not only allow connection of the semiconductor device to the lead-frame, but also acts as interconnections between separate fab metal lines. In addition, the bumps can be used to interconnect a plurality of lead-frame traces to a single fab metal line. These concepts are discussed below, after a discussion of the relevant existing technology.

FIG. 1A shows a general schematic plan view of a semiconductor die 10 having an array of passivation openings 12 formed in a passivation layer, each passivation openings 12 opening to an underlying metal contact region (e.g., gate, source, or drain metal contact region). FIG. 1B shows the semiconductor die 10 of FIG. 1A with conductive bumps 14 formed in each passivation opening 12. FIG. 1C shows a lead frame 20 having a corresponding pattern to be connected to the bumps 12 shown in FIG. 1B, thereby forming contact between the underlying metal contact regions of the semiconductor die 10 and the lead frame 20.

FIGS. 2A and 2B show a schematic plan view of a semiconductor power device and a plan view of a corresponding lead-frame, respectively, e.g., according to the '108 Application. As shown in FIG. 2A, a power semiconductor die 102 may comprise a gate (G) metal contact region 110A, drain (D) metal contact regions 110B, and source (S) metal contact regions 110C. The elongated metal contact regions 110 may be referred to as "fingers." The bump metal fingers 110 can be formed by a patterned metal layers deposited on the top of the interconnect metal layers, for example, on the top of the second metal layer. For example, the source and drain regions may be connected to metal runners on a first metal layer, then a second layer of metal may form wider metal runners that will be where the bump metal of the top contacts will be deposited.

As shown in FIG. 2B, a corresponding lead-frame 104 having a conductive frame and lead-fingers is adapted to be coupled to the semiconductor power device via a plurality of conductive bumps arranged on the various metal contact regions 110A, 110B, and 110C, in a "flip-chip" configuration, as discussed below. The lead-frame 104 shown in FIG. 1 is depicted in a "final state," in other words, any support joints between the fingers have been removed.

Figure 3:
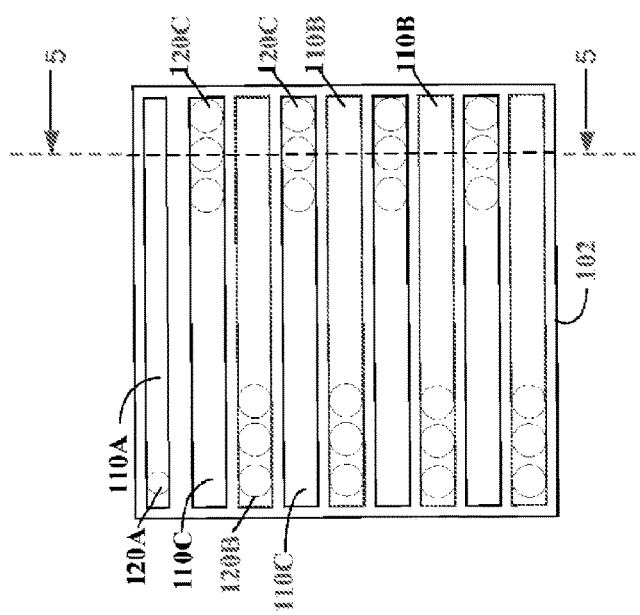

FIG. 3 shows the semiconductor power device formed on die 102 of FIG. 2A, with ball bumps 120A, 120B, and 120C formed on metal contact regions 110A, 110B, and 110C, respectively. The ball bumps may comprise solder ball bumps, conductive epoxy ball bumps, etc. The lead-frame 104 may be arranged over the semiconductor die 102 in a "flip-chip" configuration, with the fingers of the lead-frame 104 contacting the respective ball bumps 120A, 120B, and 120C on the semiconductor device. Thus, a gate lead-finger connects to the gate ball bump(s) 110A, drain lead-fingers connect to the drain ball bumps 110B, and source lead-fingers connect to the source ball bumps 110C, e.g., as discussed in the '108 Application.

Figure 4:
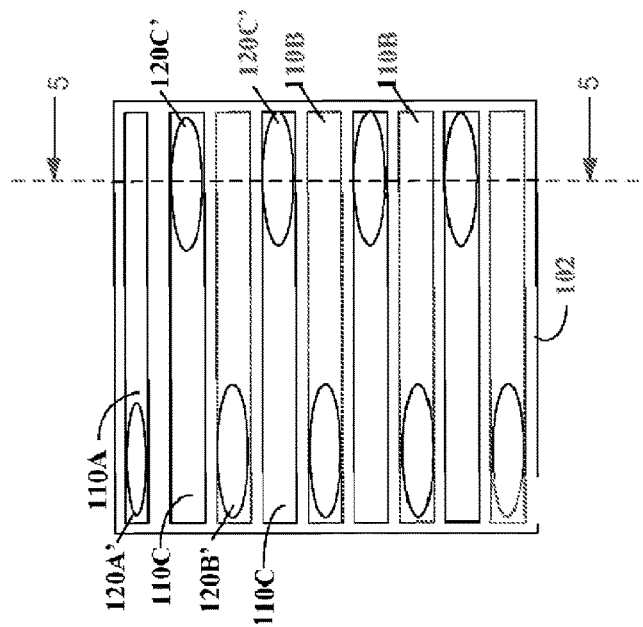
FIGS. 3 and 4 show conventional arrangement of bumps on power transistor dies.

FIG. 4 shows the semiconductor power device formed on die 102 of FIG. 2A, with elongated bumps 120A', 120B', and 120C' (as an alternative to the ball bumps shown in FIG. 3) formed on metal contact regions 110A, 110B, and 110C, respectively. The lead-frame 104 may be coupled to the elongated bumps 120A', 120B', and 120C' in a similar manner as discussed above.

Figure 5:
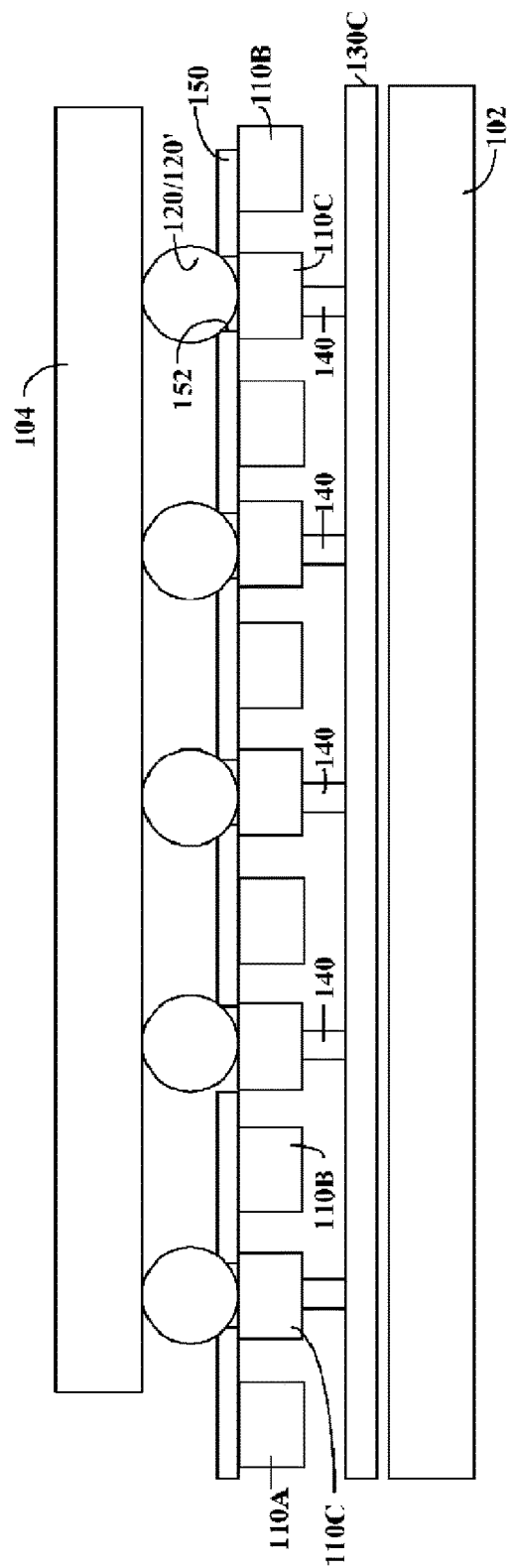
FIG. 5 shows a sectional view along lines 5-5 of FIGS. 3 and 4 of a conventional power transistor die mounted on a lead frame in flip chip technology.

FIG. 5 is a cross sectional view of the assembled lead frame and semiconductor power device taken through line "5-5" in either FIG. 3 or FIG. 4. As shown, the semiconductor power device includes a second metal layer including source metal2 lines 110C, drain metal2 lines 110B, and gate metal2 lines 110A formed over a first metal layer including source metal1 lines 130C (as well as drain metal1 lines and gate metal1 lines, which are not shown in this view), wherein the source metal2 lines 110C of the second metal layer are connected to underlying source metal1 lines 130C second metal layer by conductive vias 140. A passivation layer 150 formed over the second metal layer includes passivation openings 152 through which bumps 120 or 120' extend into contact with the respective underlying metal contact region of the second metal layer, in this view source metal2 lines 110C. Finally, the lead frame 104 is arranged in contact with the bumps 120 or 120', thereby conductively connecting the lead-frame to the semiconductor power device.

FIG. 6 shows a schematic plan view of the example dual-metal-layer semiconductor power device of FIG. 5, showing the arrangement of the second metal layer over the first metal layer, and showing both source metal1 lines 130C and drain metal1 lines 130B of the first metal layer. The vias 140 connecting the respective metal1 and metal2 layers are not shown in FIG. 6

FIGS. 7A-7C show an example of using bumps to interconnect separate metal contact regions/lines of the semiconductor device, while providing connection to the lead frame according to various embodiments. FIG. 7A shows a schematic plan view of a semiconductor die 10 having an array of passivation openings 12 formed in a passivation layer, each opening to an underlying metal contact region, e.g., as discussed above regarding FIG. 1A. Within the semiconductor, the metal layers underlying the openings 12 may not be connected. Thus, conventional devices would require an additional metal layer. According to various embodiments, such additional layers can be avoided.

FIG. 7B shows the semiconductor die 10 of FIG. 1A with ball bumps 200 formed in some passivation openings 12, and interconnecting bumps 200a', 200c', 200e' formed in other passivation openings 12a-f and extending over the passivation layer to connect two or more underlying metal contact regions. Thus, interconnecting bump 200a' connects the two metal layers through passivation layer openings 12a and 12b. Interconnecting bump 200c' connects the two metal layers through passivation layer openings 12c and 12d, and interconnecting bump 200e' connects the two metal layers through passivation layer openings 12e and 12f. Other configurations are possible and an interconnecting bump 200' may also connect more than two underlying metal layers according to other embodiments.

FIG. 7C shows a lead frame 20 having a corresponding pattern to be connected to the bumps 200 and 200', thereby forming contact between the underlying metal contact regions of the semiconductor die 10 and the lead frame 20. Each interconnecting bump 200' may connect any suitable number of underlying metal contact regions, e.g., two, three, four, or more contact regions. Also, a particular configuration may include both interconnecting bumps 200' and non-interconnecting bumps 200 (e.g., the ball bumps shown in FIG. 7B), or may include only interconnecting bumps 200'.

Interconnecting bumps 200' may thus provide routing in the bump layer, which may replace one layer of metal interconnect. Thus, in some embodiments, the semiconductor device may need only a single metal interconnect layer, as opposed to the two metal layers included in the design of FIGS. 5 and 6, which reduction of a metal layer may reduce fabrication costs. In addition, the use of such interconnecting bumps 200' may provide a "top metal layer" with lower resistance, as compared with the design of FIGS. 5 and 6.

FIG. 8 shows a schematic plan view of an example arrangement of interconnecting bumps 200' on a single-metal-interconnect-layer semiconductor device 210, e.g., a power-FET device, according to one example embodiment. As shown, device 210 includes a single metal interconnect layer including a gate metal line 230A, drain metal lines 230B, and source metal lines 230C. A bump 200A is formed over, and in connection with, gate metal line 230A via a corresponding passivation opening 260. The passivation opening 260 may be adapted in size depending on the size of the respective metal line 230A, 230B, 230C. A plurality of drain interconnection bumps 200B' are formed to interconnect separate drain metal lines 230B via respective passivation openings, and a plurality of source interconnection bumps 200C' are formed to interconnect separate source metal lines 230C via respective passivation openings.

Figure 9:
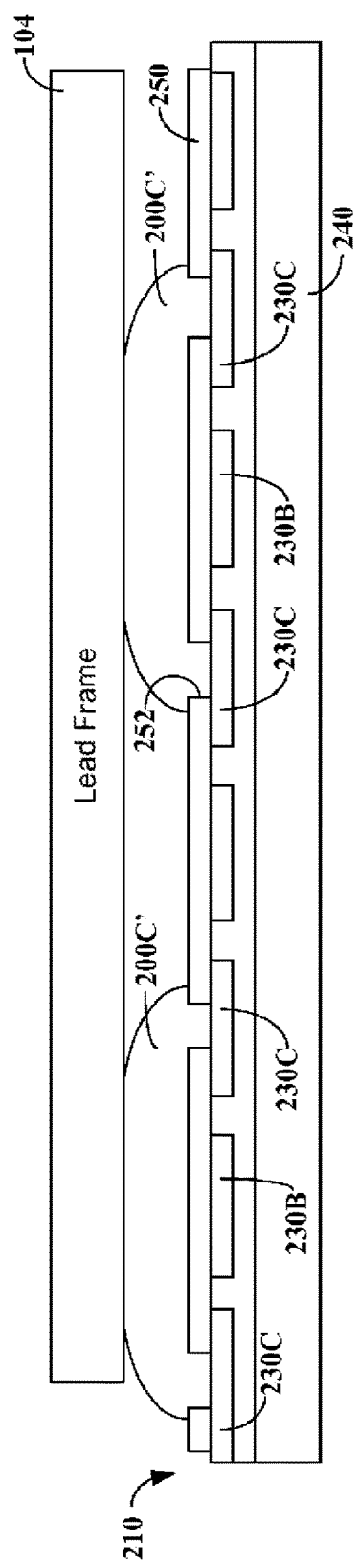
FIG. 9 shows a sectional view along lines 9-9 of FIG. 8.

FIG. 9 is a cross sectional view of semiconductor power device 210 of FIG. 8, taken through line "9-9" shown in FIG. 8, and showing a lead frame 104 assembled to the semiconductor power device 210, in a flip-chip mounting configuration. As shown, the semiconductor power device 210 includes a single metal interconnect layer including source metal1 lines 230C, drain metal1 lines 230B, and gate metal2 line(s) (not shown), formed on a semiconductor die 240. A passivation layer 250 formed over the metal interconnect layer includes passivation openings 252 through which source interconnection bumps 200C' extend into contact with multiple separate underlying source metal1 lines 230C, such that each source interconnection bump 200C' connects multiple source metal1 lines 230C to the lead-frame, thereby providing routing in the bump layer, and allowing for the elimination of a second metal interconnect layer, as discussed above.

Figures 10, 11:
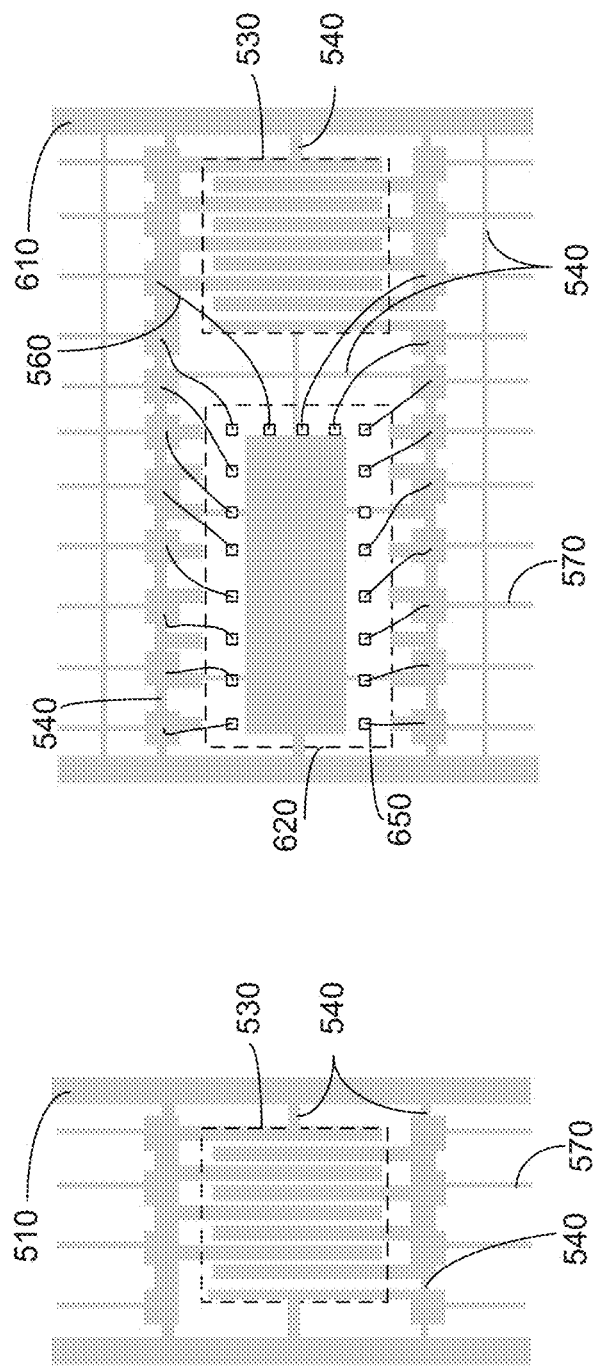
FIG. 10-12 show examples of lead frames with power transistors according to some embodiment.

FIG. 10 shows a first example of a chip 530 mounted on a lead-frame 510 as explained above. The lead-frame may have a plurality of external pins 570, in the shown example 8 pins. The power transistor chip 530 shown uses four pins 570 for the drain connection and three pins 570 for the source connection. A single pin is used for the gate connection. For mounting purposes and before encapsulation, the lead-frame may comprise a plurality of support connections, three of which are referenced by reference symbol 540. The pins 570 for the external connection may be single pins or form a group of connected pins as shown in FIG. 10. Thus, any support connection between these pins within a group may remain. Also according to other embodiments, wider pins may be used for the source drain connection to support a higher current.

Certain applications of control circuits, in particular microcontroller applications, require the control of power transistors, for example, switch mode power supply controllers, buck converters or motor control applications. Such applications therefore use generally separate discrete power transistors. According to various embodiments, a pulse width modulator or even a microcontroller can be packaged together with a power transistor as described above.

FIG. 11 shows an example of a lead-frame 610 that can support a first chip 620, for example a microcontroller chip, coupled to the lead-frame 610 in conventional bonding technique and a second chip 530 comprising one a power transistor as described above and mounted to the lead-frame using the above mentioned flip chip bump bonding technique. Reference symbol 570 again indicates an external pin of the lead-frame 510. Lead-frame 610 is furthermore shown in FIG. 11 with a plurality of support connections, four of them indicated by reference symbol 540. As mentioned above, these support structures are cut out before enclosing the device in a housing to eliminate any unwanted shorts in the frame and proper connection to the designated pin 570. As shown the first chip 620 can be interconnected to at least one of the source, drain and gate fingers at appropriate connection points on the lead-frame 610. While the first chip 620 uses single pins 570 for each connection to a bond pad 650, the section of the lead-frame for the second chip may again connect multiple pins 570 to each source and drain connection to provide a low resistance and support for high currents. However, other external pins, for example, wider pins may be used for the source and/or drain contacts of the second chip 530 according to various embodiments. As mentioned above, the first chip 520 can be a pulse width modulation device, a controller or a microcontroller operable to directly interface with a power transistor. To this end, these devices have integrated drivers that are capable of directly driving the gate of the power transistor.

Figure 12:
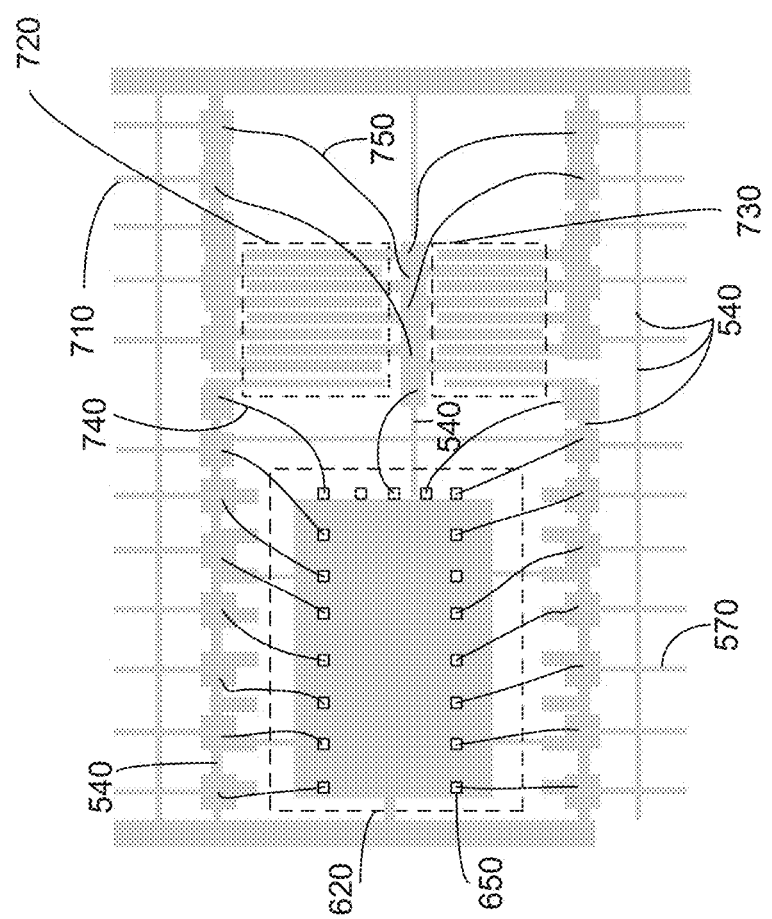

FIG. 12 shows yet another embodiment comprising a lead-frame 710 with a microcontroller chip 620 connected by standard wire-bonding and two power transistor chips 720 and 730 mounted in flip chip technology as explained above. The section on the right comprises the two power transistors. Here, additional external pins 710 are provided in comparison with FIG. 11 for coupling with the interconnected source-drain section 310 via bonding wires 750. Any source, drain and/or gate of the two transistor chips 720, 730 may be connected to a bond pad 650 via a bond wire 740 of the microcontroller chip 620 as exemplarily shown in FIG. 12. Again, FIG. 12 shows a plurality of support structures 540 that will be removed before encapsulation.

Figure 13:
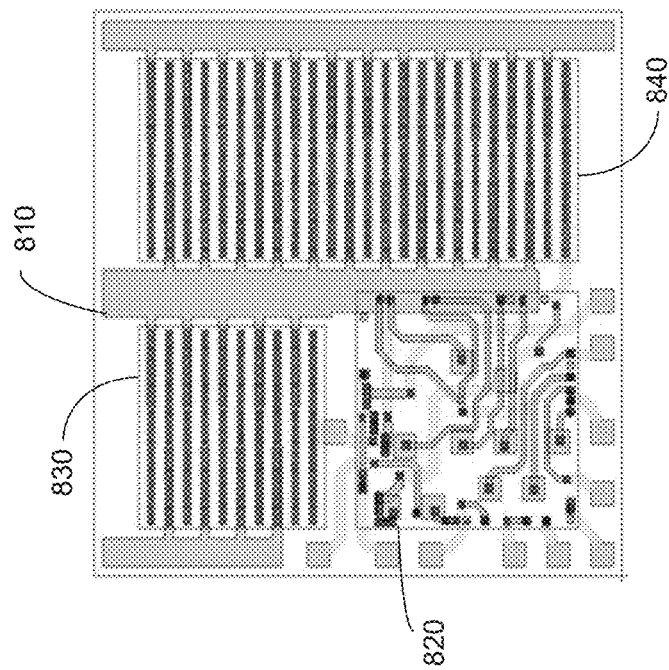

FIG. 13 shows yet another embodiment comprising a lead-frame 810 with a microcontroller chip 820 or any other control unit as suitable and two power transistor chips 830 and 840. In this embodiment, all chips are mounted in flip chip technology as explained above. As can be seen in this embodiment, no bond wires are used at all. Thus, the controller chip 820 is also designed in flip chip technology. The lead frame 810 is used to provide for the interconnections between the microcontroller chip 820 and the two power transistors 830 and 840. The controller chip 820 uses a redistribution layer and is then bumped to the lead frame 810. It's then placed on the lead frame and the lead frame is etched to provide the routing.

As can be seen in FIG. 13, in this embodiment, the power transistor 840 is twice the size of the power transistor 830. For some applications the lower FET with its source connected to ground is two time times the upper FET which is coupled with the supply voltage Vin. For example, such an application may use a supply voltage of 12V in and 0.8 to 2.5 output voltage Vout in a switch mode power supply. However, other dimensions for the FETs may be chosen and FIG. 13 merely shows one possible arrangement.

Figure 14:
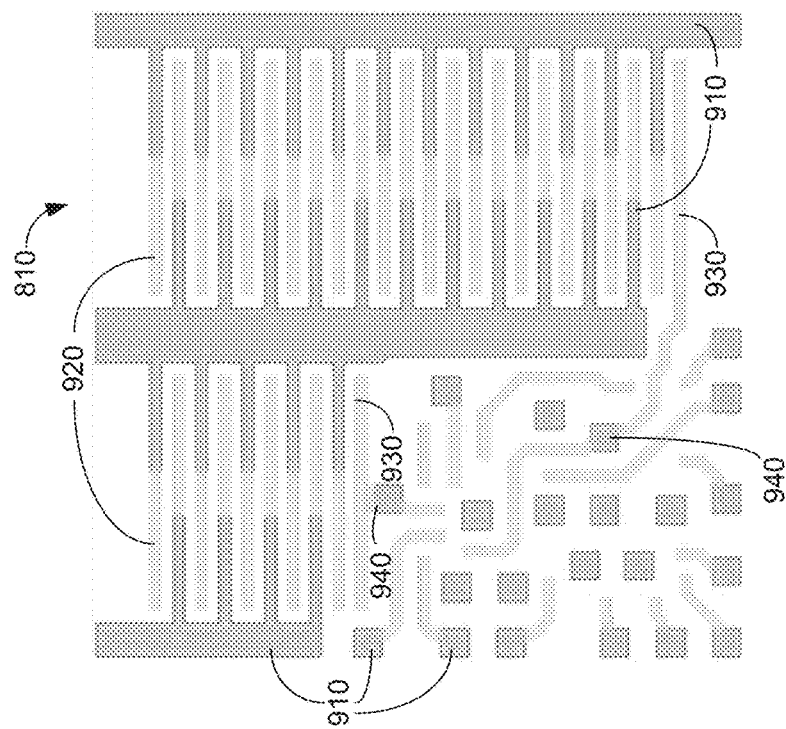
FIGS. 13 and 14 show a lead frame and power transistor chips arrangement according to some embodiments.

FIG. 14 shows only the lead frame 810 of FIG. 13 alone, wherein the parts 910 that will be finally exposed in the packaged integrated circuit are shaded darker than the other parts 920 of the lead frame. Thus, only the darker shaded areas 910 will get soldered down on a printed circuit board. The lighter green areas 920 are still lead-frame, but they are only exposed inside the package where the respective dies will be flipped onto, or they are used for routing signals, in particular for the microcontroller chip 820.

Thus, elongated strips and parts of the respective connection fingers are used to provide a large external connection area for the power transistors 830 and 840 suitable to carry large currents, wherein small square connection pads are provided for the microcontroller chip 820. Numeral 930 shows the gate connection to the respective transistors 830 and 840 and the respective connections to the controller chip 820. The gate connection is also externally accessible through respective small pads 940 which are here associated with the controller chip 820.

Figure 15:
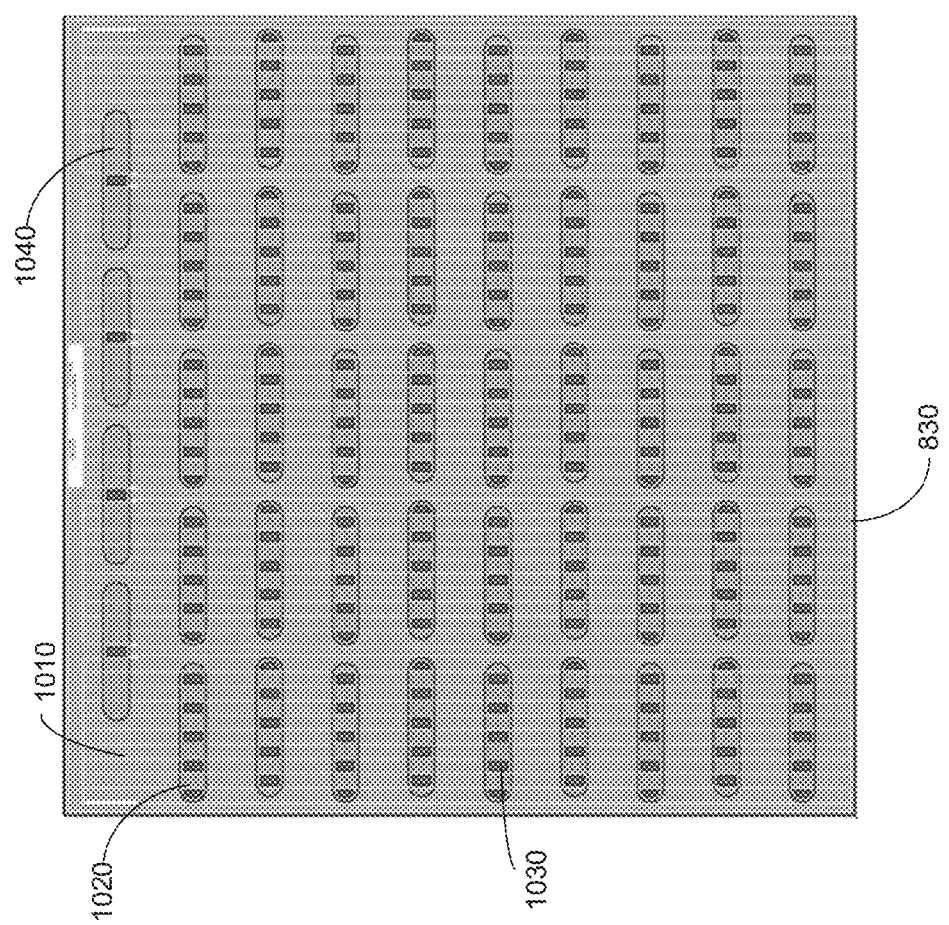
FIG. 15 shows a power transistor according to yet another embodiment.

FIG. 15 shows another example of how a power transistor chip 830 can be mounted and connected to in flip chip technology within a package. The vertical lines 1010 are the fab metal1 lines, the ovals 1020, 1040 are the bumps, and the smaller squares 1030 are the passivation openings. Thus, FIG. 15 shows how the bump interconnect the individual metal1 lines in one possible arrangement. As can be seen in this embodiment, each bump 1020 associated with the drain or source fingers connects multiple fingers, for example 5 fingers wherein the bumps 1040 only use a single opening 1030 to connect to the respective gate fingers. This chip 830 is then flipped over onto the stripes of an associated lead-frame 810 as shown in FIG. 13.

Figure 17:
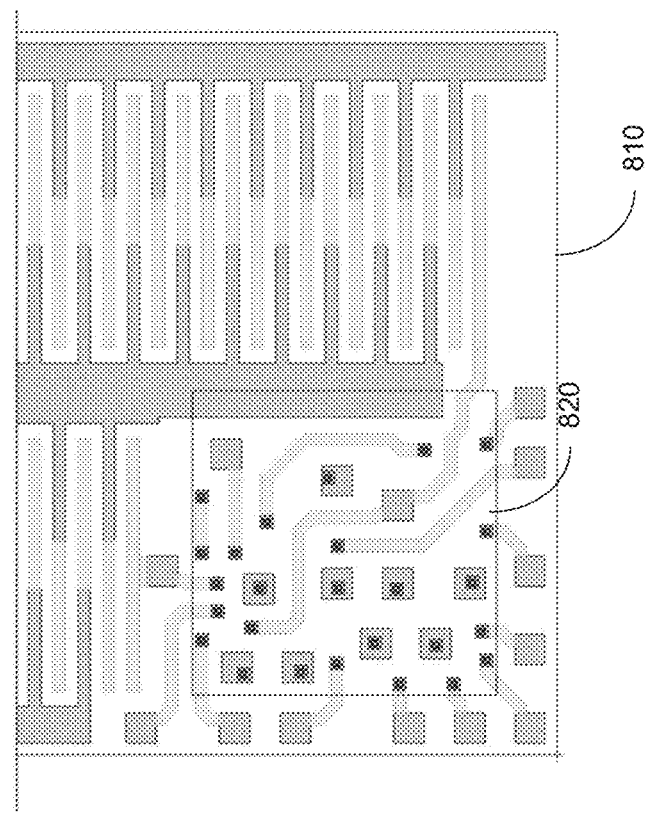
FIGS. 16 and 17 show a microcontroller chip and placement on a lead frame in flip-chip technology.
Figure 16:
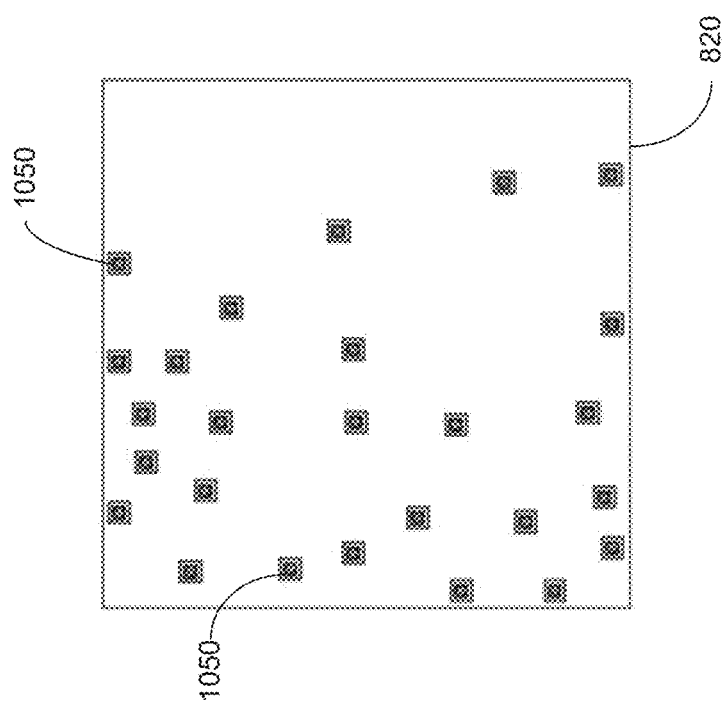

FIG. 16 shows a bottom view of a microcontroller chip 820 with only the connection pads 1050 showing. FIG. 17 shows an enlarged section of FIG. 13 with the microcontroller placed on the lead frame. Similar as shown in FIG. 17, the chips 820-840 are indicated to be arranged under the lead frame 810.

Figure 18:
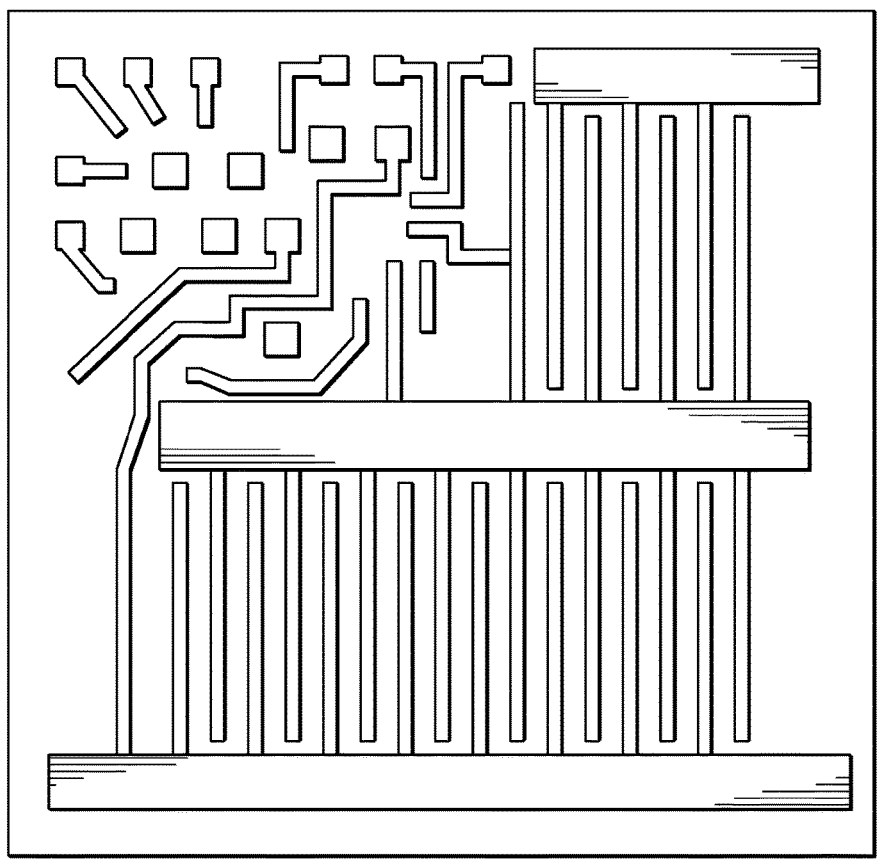
FIG. 18 shows a photo of a lead frame according to an embodiment.
Figure 19:
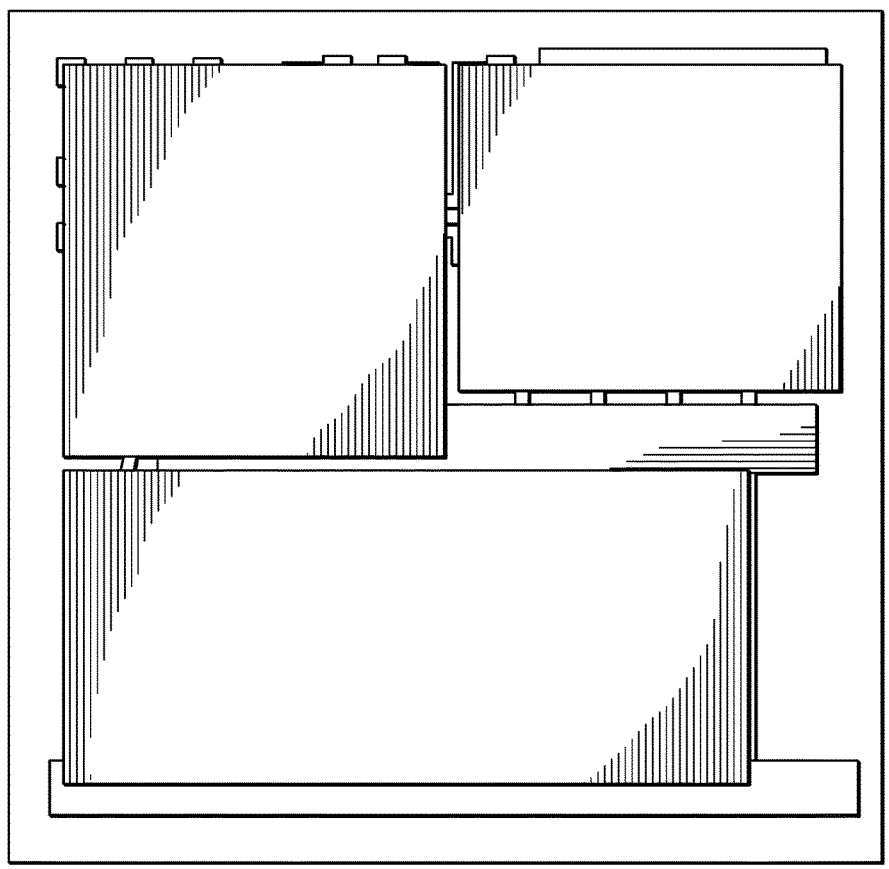
FIG. 19 shows a photo of a lead frame with mounted chips according to an embodiment.
Figure 20:
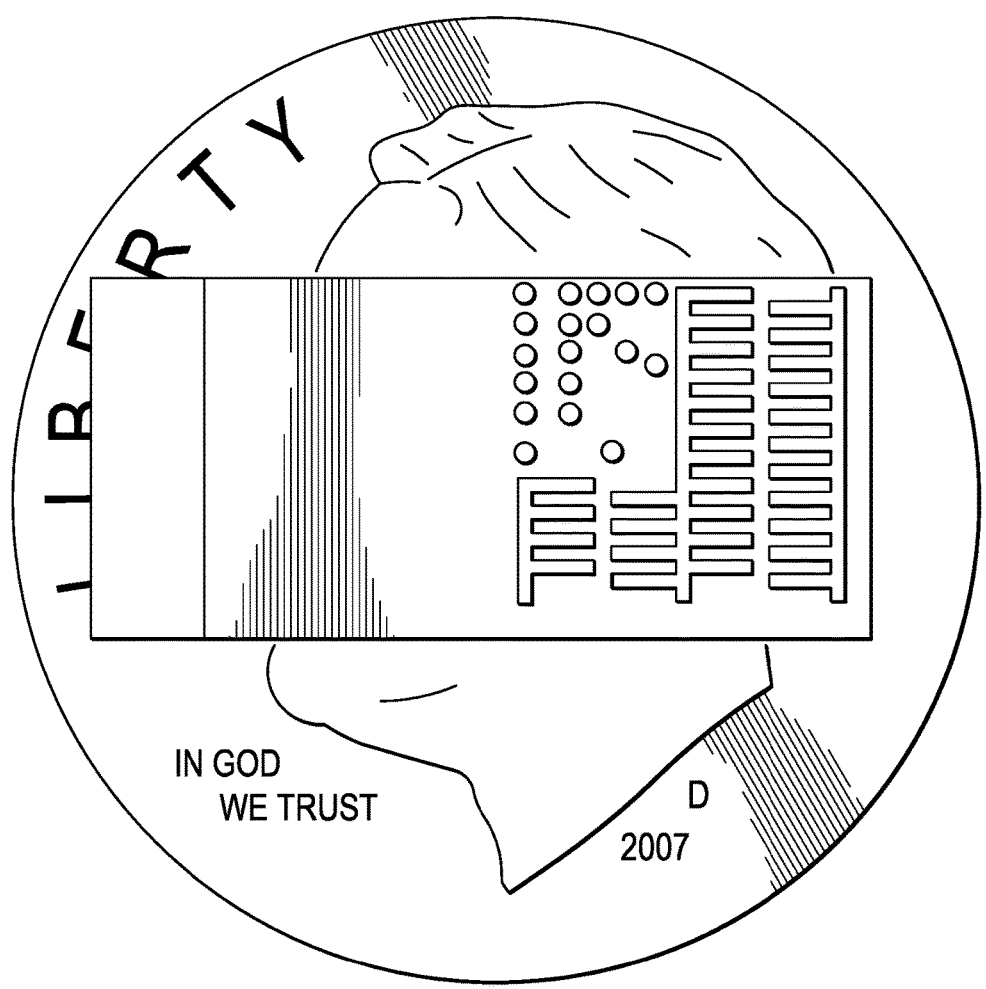
FIG. 20 shows a photo of multi-die integrated circuits in top and bottom view according to an embodiment.
Figure 21:
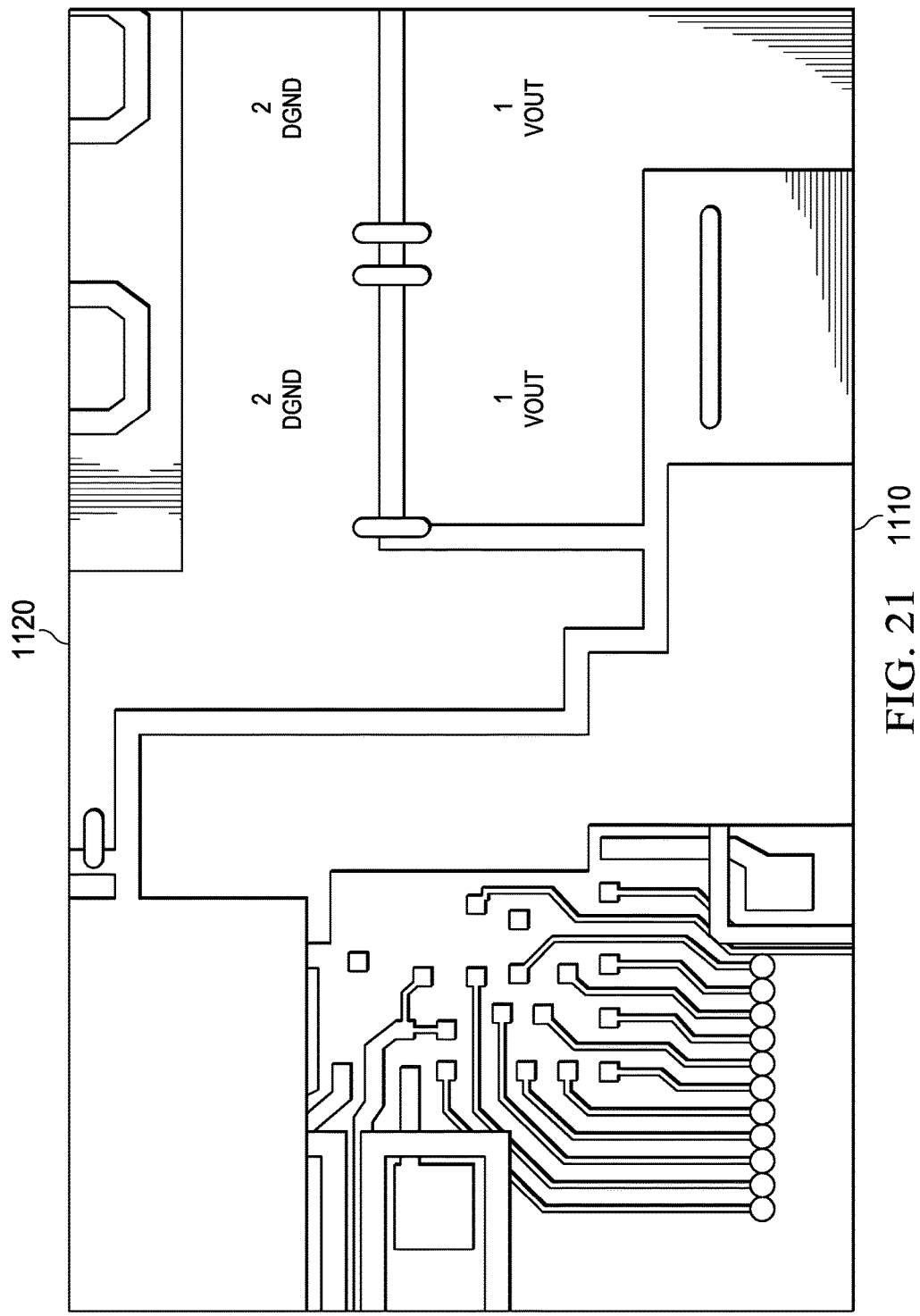
FIG. 21 shows an exemplary layout of a printed circuit board designed to receive an integrated circuit as shown in FIG. 20.

FIG. 18 shows an actual picture of a lead frame by itself before mounting. The with areas are the areas exposed for external connection. FIG. 19 shows the lead frame with 3 semiconductor chips flipped and mounted thereon. FIG. 20 shows a top view two final integrated circuit package, wherein one chip has been turned upside down, in comparison to a coin. FIG. 21 shows an exemplary design of a printed circuit board as shown in a respective CAD program. As can be seen large connection areas 1110 and 1120 are provided to connect to the lead frame areas provided for the source and drain for the lower FET 840.

The principle arrangement of controller chip and power transistors as shown in the embodiments of FIGS. 13-20 can also be applied to a controller and a single power transistor as shown in FIG. 11. The embodiments shown in the various figures are not restricted to field effect transistors but may also be used for any type of bipolar transistor structure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure.

What is claimed is:

1. An apparatus, comprising:
   an array of conductive contact elements;
   a passivation layer formed over the plurality of conductive contact elements, the passivation layer comprising passivation openings over a plurality of the conductive contact elements;
   an array of conductive bumps including one or more interconnection bumps, wherein each interconnection bump is formed over the passivation layer and extends into at least two of the passivation openings and into contact with at least two underlying conductive contact elements to thereby provide a conductive coupling between the at least two underlying conductive contact elements;
   a frontside drain connection;
   a frontside source connection within a same cell of source metal as the frontside drain connection; and
   only a single metal interconnect layer, which includes the array of conductive contact elements;
   wherein the frontside source connection and the frontside drain connection are covered by a same conductive bump.

2. The apparatus of claim 1, wherein the array of conductive contact elements comprises at least one gate contact element, at least one source contact element, and at least one drain contact element.

3. The apparatus of claim 1, wherein the array of conductive contact elements comprises a plurality of elongated contact strips arranged in parallel.

4. The apparatus of claim 2, wherein a plurality of passivation openings are arranged over each source and drain contact elements.

5. The apparatus of claim 1, wherein the one or more interconnection bumps comprises at least one source interconnection bump that provides a conductive coupling between at least two electrically isolated source regions.

6. The apparatus of claim 1, wherein the one or more interconnection bumps comprises at least one drain interconnection bump that provides a conductive coupling between at least two electrically isolated drain regions.

7. The apparatus of claim 1, further comprising a lead frame coupled to the array of conductive bumps, such that the one or more interconnection bumps provide a conductive coupling between at least a portion of the array of conductive contact elements and the lead frame.

8. The apparatus of claim 1, wherein the array of conductive bumps includes one or more non-interconnection bumps, each extending into contact with only a single underlying conductive contact.

9. The apparatus of claim 1, wherein the array of conductive bumps includes two or more interconnection bumps and only interconnection bumps.

10. The apparatus of claim 2, further comprising:
    a lead-frame having an area comprising gate, source and drain lead-fingers adapted to match up with the array of conductive bumps for connecting to each of the at least one gate contact element, a plurality of source contact elements and a plurality of drain contact elements, and
    a housing surrounding said semiconductor power chip and said lead-frame.

11. A semiconductor power device, comprising at least a first and second semiconductor power chip, each semiconductor power chip being formed according to the apparatus of claim 2, further comprising:
    a lead-frame having a first and second area each first and second area comprising gate, source and drain lead-fingers adapted to match up with the array of conductive bumps for connecting to each of the at least one gate contact element, the plurality of source contact elements and the plurality of drain contact elements of said first and second semiconductor chips, respectively, and
    a housing surrounding said first and second semiconductor power chip and said lead-frame.

12. The apparatus of claim 2, further comprising:
    another chip;
    a lead-frame having a first area comprising gate, source and drain lead-fingers adapted to match up with the array of conductive bumps for connecting to each of the at least one gate contact element, a plurality of source contact elements and a plurality of drain contact elements of the semiconductor power chip and a second area configured for wire bonding or flip-chip coupling said another chip, and
    a housing surrounding a semiconductor power chip, said another chip, and said lead-frame.

13. The apparatus of according to claim 12, wherein the another chip is a microcontroller chip operable to control said semiconductor power chip.

14. The apparatus of according to claim 12, wherein the another chip is a pulse width modulation chip operable to control said semiconductor power chip.

15. The apparatus of according to claim 12, wherein the another chip is mounted in flip-chip fashion.

16. The apparatus of according to claim 15, wherein the lead frame is designed to provide connection between the another chip and the semiconductor power chip.

17. An apparatus comprising at least a first and second semiconductor power chip, each semiconductor power chip being formed according to claim 2, further comprising:
a third chip;
a lead-frame having an first and second area each first and second area comprising gate, source and drain lead-fingers adapted to match up with the array of conductive bumps for connecting to each of the at least one gate contact element, a plurality of source contact elements and a plurality of drain contact elements of said first and second semiconductor chips, respectively and a third area configured for wire bonding said another chip, and
a housing surrounding said first and second semiconductor power chip, said third chip and said lead-frame.

18. The apparatus of according to claim 17, wherein the third chip is a microcontroller chip operable to control said semiconductor power chip.

19. The apparatus of according to claim 17, wherein the third chip is a pulse width modulation chip operable to control said semiconductor power chip.

20. The apparatus of according to claim 17, wherein the third chip is mounted in flip-chip fashion.

21. The apparatus of according to claim 20, wherein the lead frame is designed to provide connection between the third chip and the first and second semiconductor power chip.

22. An apparatus, comprising:
a housing;
a lead-frame arranged in flip-chip configuration within said housing;
an array of conductive contact elements comprising at least one gate contact element, at least one source contact element, and at least one drain contact element, and a passivation layer formed over the plurality of conductive contact elements, the passivation layer comprising passivation openings over a plurality of the conductive contact elements;
only a single metal interconnect layer, which includes the array of conductive contact elements;
an array of conductive bumps including one or more interconnection bumps, wherein each interconnection bump is formed over the passivation layer and extends into at least two of the passivation openings and into contact with at least two underlying conductive contact elements to thereby provide a conductive coupling between the at least two underlying conductive contact elements;
a frontside drain connection;
a frontside source connection within a same cell of source metal as the frontside drain connection; and
wherein the frontside source connection and the frontside drain connection are covered by a same conductive bump and
wherein the lead-frame has an area comprising gate, source and drain lead-fingers adapted to match up with the array of conductive bumps for connecting to each of the at least one gate contact element, a plurality of source contact elements and a plurality of drain contact elements.

23. The apparatus of claim 22, wherein the array of conductive contact elements comprises a plurality of elongated contact strips arranged in parallel.

24. The apparatus of claim 22, wherein a plurality of passivation openings are arranged over each source and drain contact elements.

25. The apparatus of claim 22, wherein the one or more interconnection bumps comprises at least one source interconnection bump that provides a conductive coupling between at least two electrically isolated source regions.

26. The apparatus of claim 22, wherein the one or more interconnection bumps comprises at least one drain interconnection bump that provides a conductive coupling between at least two electrically isolated drain regions.

* * * * *